(12) United States Patent
Yokouchi

(10) Patent No.: US 8,802,550 B2
(45) Date of Patent: Aug. 12, 2014

(54) HEAT TREATMENT METHOD FOR HEATING SUBSTRATE BY IRRADIATING SUBSTRATE WITH FLASH OF LIGHT

(75) Inventor: Kenichi Yokouchi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 13/603,584

(22) Filed: Sep. 5, 2012

(65) Prior Publication Data

US 2013/0078822 A1 Mar. 28, 2013

(30) Foreign Application Priority Data

Sep. 27, 2011 (JP) ................. 2011-210388

(51) Int. Cl.
*H01L 21/22* (2006.01)
*H01L 21/38* (2006.01)
*H01L 21/24* (2006.01)
*H01L 21/40* (2006.01)
*H01L 21/00* (2006.01)
*H01L 21/145* (2006.01)
*H01L 21/16* (2006.01)

(52) U.S. Cl.
USPC .... 438/550; 438/540; 438/799; 257/E21.077; 257/E21.084

(58) Field of Classification Search
USPC ......... 438/795–799, 502, 509, 522, 530, 540, 438/550, 660, 715, 781; 257/E21.077, 257/E21.084
See application file for complete search history.

(56) References Cited

U.S. PATENT DOCUMENTS

| 6,849,831 | B2 | 2/2005 | Timans et al. ................ 219/390 |
| 6,998,580 | B2 | 2/2006 | Kusuda et al. ................ 219/411 |
| 2004/0112890 | A1 | 6/2004 | Kusuda et al. |
| 2005/0247685 | A1* | 11/2005 | Tanaka et al. ............ 219/121.82 |
| 2007/0092807 | A1* | 4/2007 | Fukushima et al. .............. 430/5 |
| 2008/0214020 | A1* | 9/2008 | Ito et al. ........................ 438/795 |
| 2010/0151696 | A1* | 6/2010 | Ito et al. ........................ 438/798 |
| 2011/0262115 | A1 | 10/2011 | Yokouchi ..................... 392/407 |

FOREIGN PATENT DOCUMENTS

| JP | 2003-289049 | 10/2003 |
| JP | 2008-192924 | 8/2008 |
| JP | 2011-086645 | 4/2011 |
| JP | 2011-119562 | 6/2011 |
| KR | 10-2004-0049788 | 4/2004 |
| KR | 10-2005-0038763 | 4/2005 |

OTHER PUBLICATIONS

Office Action issued by Korean Patent Office on Sep. 16, 2013 in connection with corresponding Korean Patent Application No. 10-2005-0038763 with Japanese and English Translation thereof.

* cited by examiner

*Primary Examiner* — Calvin Choi
(74) *Attorney, Agent, or Firm* — Ostrolenk Faber LLP

(57) ABSTRACT

First flash irradiation from flash lamps is performed on an upper surface of a semiconductor wafer supported on a temperature equalizing ring of a holder to cause the semiconductor wafer to jump up from the temperature equalizing ring into midair. While the semiconductor wafer is in midair above the temperature equalizing ring, second flash irradiation from the flash lamps is performed on the upper surface of the semiconductor wafer to increase the temperature of the upper surface of the semiconductor wafer to a treatment temperature. Cracking in the semiconductor wafer is prevented because the second flash irradiation is performed while the semiconductor wafer is in midair and subject to no restraints.

4 Claims, 12 Drawing Sheets

F I G . 2
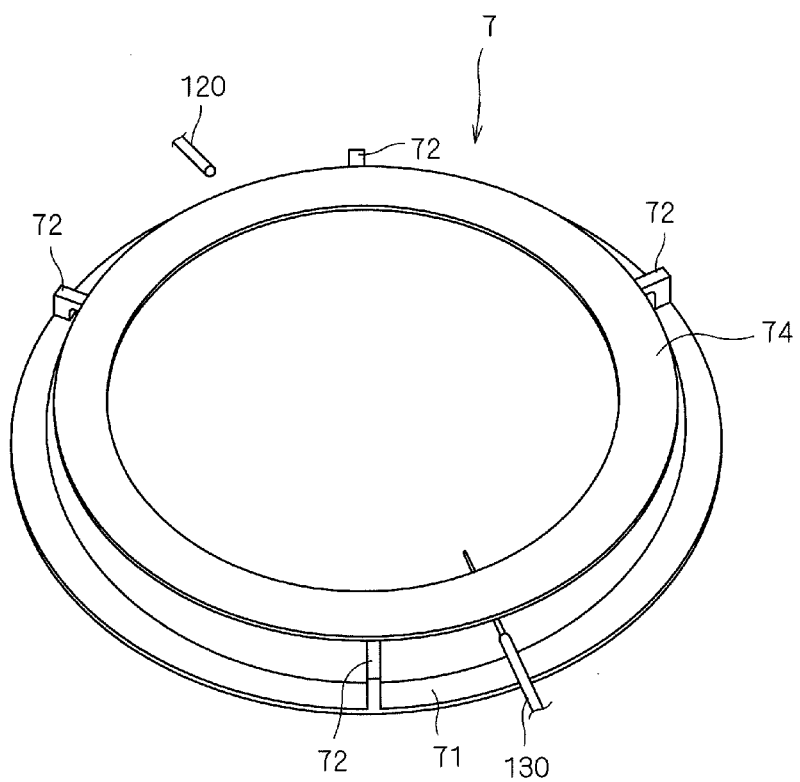

F I G . 3
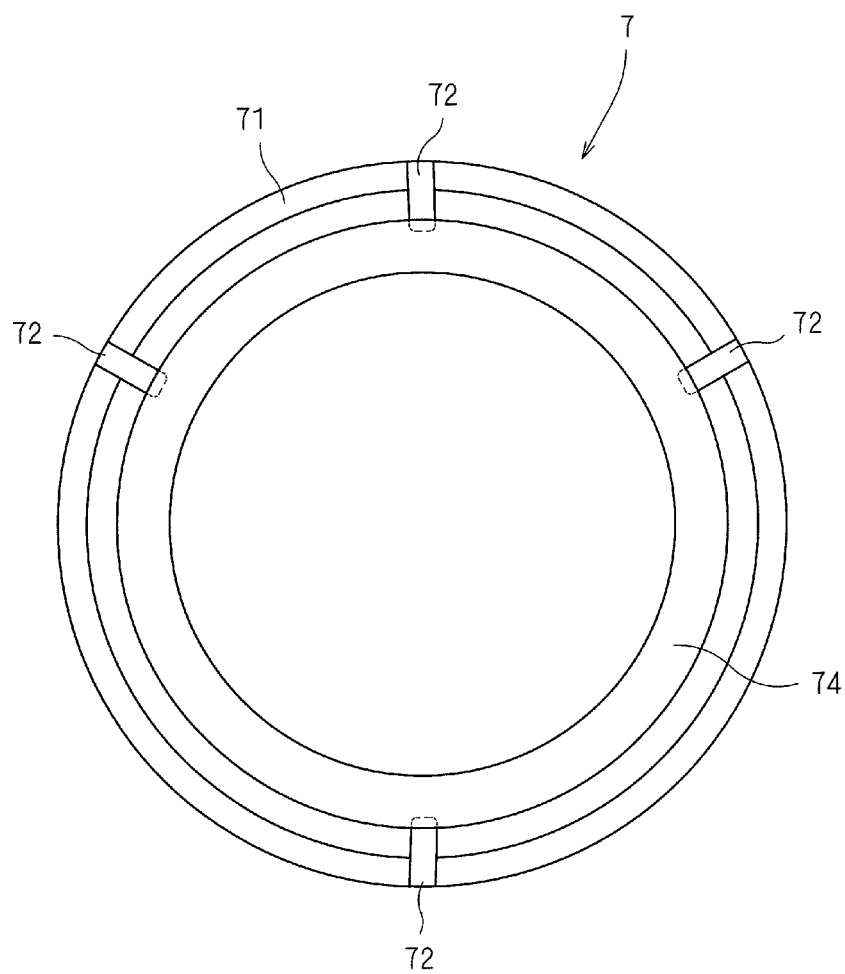

F I G. 4
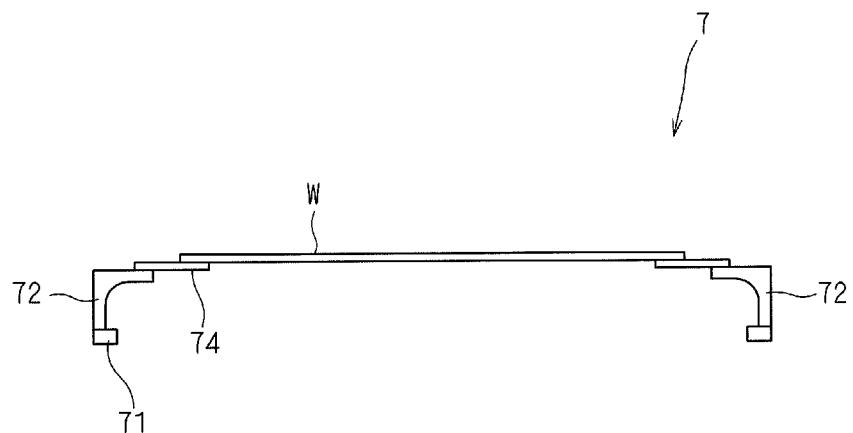

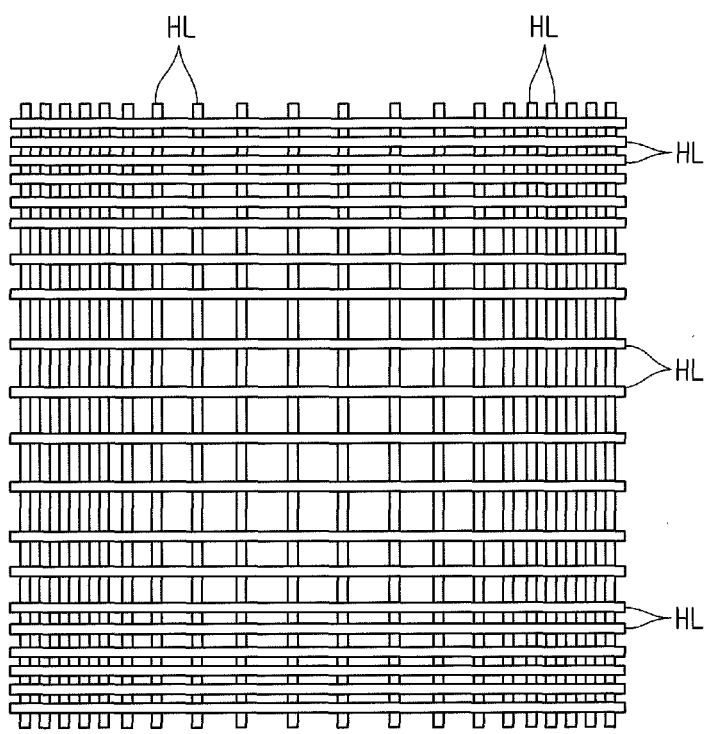
F I G . 7

F I G . 1 2
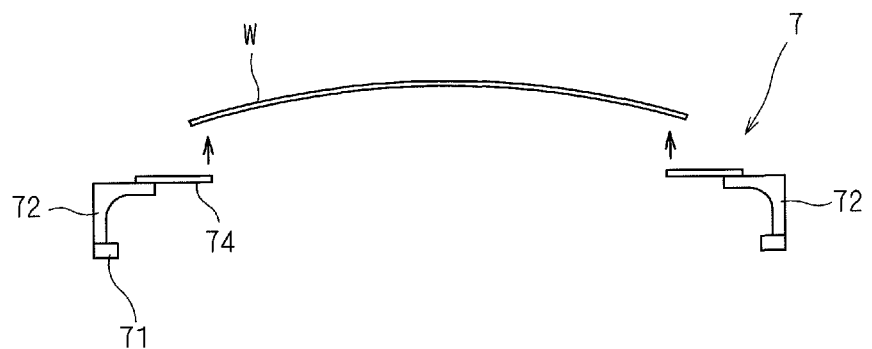

HEAT TREATMENT METHOD FOR HEATING SUBSTRATE BY IRRADIATING SUBSTRATE WITH FLASH OF LIGHT

BACKGROUND OF THE INVENTION

1. Field of the Invention

The present invention relates to a heat treatment method for heating a thin plate-like precision electronic substrate such as a semiconductor wafer and a glass substrate for a liquid crystal display device (hereinafter referred to simply as a "substrate") by irradiating the substrate with a flash of light.

2. Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer doped with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

A heat treatment apparatus which employs such xenon flash lamps is disclosed in U.S. Pat. No. 6,998,580 in which the flash lamps are disposed on the front surface side of a semiconductor wafer and a thermal diffuser and a hot plate are disposed on the back surface side thereof so that a desired heat treatment is performed using a combination of these components. In the heat treatment apparatus disclosed in U.S. Pat. No. 6,998,580, a semiconductor wafer is placed on the thermal diffuser, and is preheated to a certain degree of temperature by the hot plate. Thereafter, the temperature of the semiconductor wafer is raised to a desired treatment temperature by the irradiation with flashes of light from the flash lamps.

However, a heat treatment apparatus employing such xenon flash lamps as disclosed in U.S. Pat. No. 6,998,580, which momentarily irradiates the front surface of a semiconductor wafer with a flash of light having ultrahigh energy, raises the temperature of the front surface of the semiconductor wafer rapidly for a very short period of time to cause abrupt thermal expansion of the front surface of the semiconductor wafer, so that the semiconductor wafer tends to become deformed. However, the thermal diffuser on which the semiconductor wafer is placed prevents such deformation, so that reaction stresses are exerted on the semiconductor wafer. As a result, there is a danger that wafer cracking occurs with a high probability.

SUMMARY OF THE INVENTION

The present invention is intended for a method of heating a substrate by irradiating the substrate with a flash of light.

According to an aspect of the present invention, the method comprises the steps of: (a) supporting a substrate on a support member; (b) irradiating an upper surface of the substrate supported on the support member with a first flash of light to cause the substrate to jump up from the support member; and (c) irradiating the upper surface of the substrate with a second flash of light to perform a heating treatment while the substrate is jumping in midair above the support member.

While the substrate is jumping in midair above the support member, the heating treatment is performed by irradiating the upper surface of the substrate with the second flash of light. If the substrate becomes deformed by the second flash of light, this method avoids the contact between the substrate and other members to prevent cracking in the substrate.

It is therefore an object of the present invention to prevent cracking in a substrate when the substrate is irradiated with a flash of light.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view showing the entire external appearance of a holder;

FIG. 3 is a top plan view of the holder;

FIG. 4 is a side view of the holder as seen from one side;

FIG. 7 is a plan view showing an arrangement of halogen lamps;

FIG. 12 is a view showing a semiconductor wafer at the instant of jumping from a temperature equalizing ring.

DESCRIPTION OF THE PREFERRED EMBODIMENTS

A preferred embodiment according to the present invention will now be described in detail with reference to the drawings.

Figure 1:
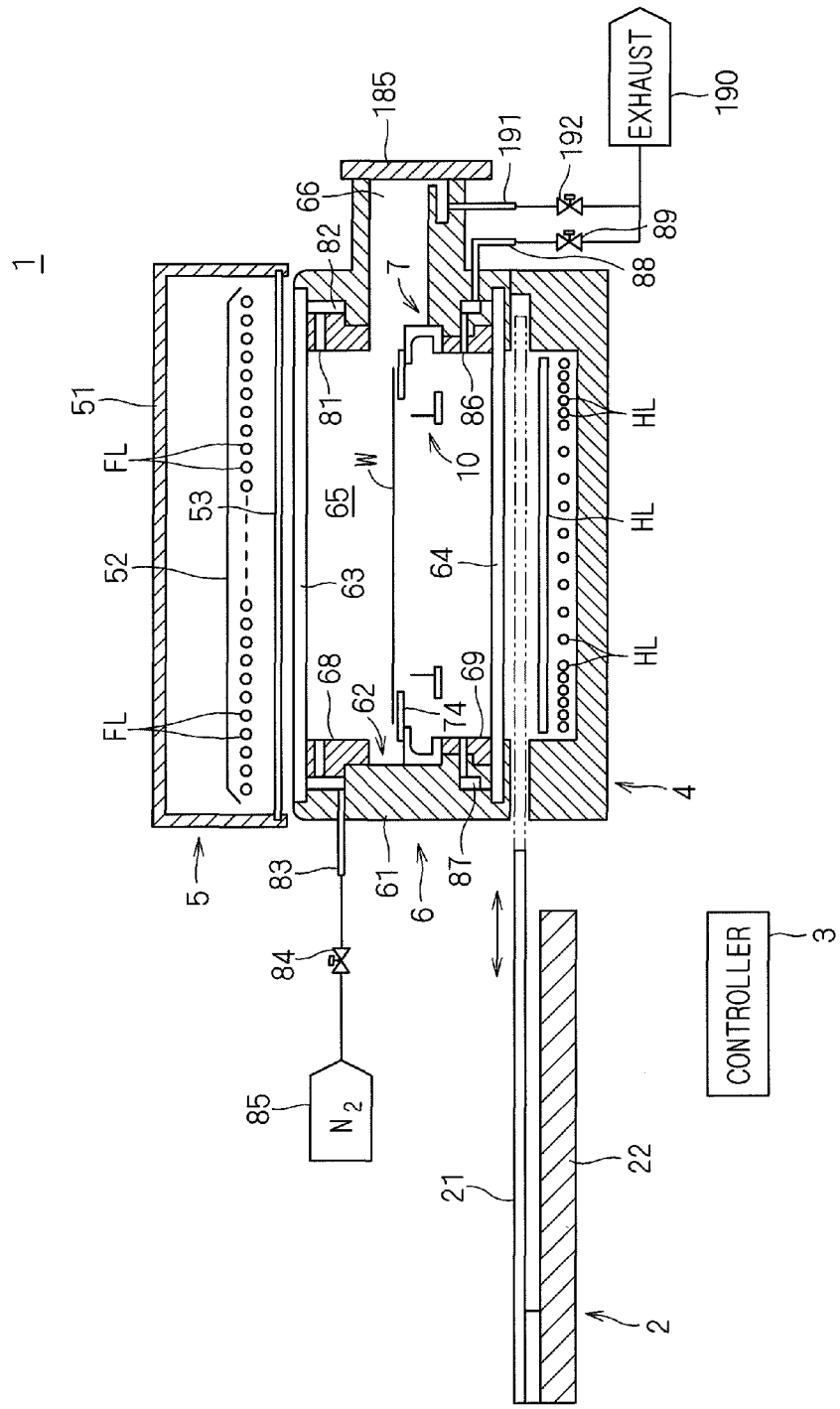
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 according to the preferred embodiment of the present invention is a flash lamp annealer for irradiating a disk-shaped semiconductor wafer W having a diameter of 300 mm and serving as a substrate with a flash of light to heat the semiconductor wafer W. A semiconductor wafer W prior to the transport into the heat treatment apparatus 1 is doped with impurities. The heat treatment apparatus 1 performs a heating treatment on the semiconductor wafer W to thereby activate the impurities introduced in the semiconductor wafer W.

The heat treatment apparatus 1 includes a chamber 6 for receiving a semiconductor wafer W therein, a flash heating part 5 including a plurality of built-in flash lamps FL, a halogen heating part 4 including a plurality of built-in halogen lamps HL, and a shutter mechanism 2. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal position, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the shutter mechanism 2, the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W.

The chamber side portion 61, and the upper and lower reflective rings 68 and 69 are made of a metal material (e.g., stainless steel) with high strength and high heat resistance. The inner peripheral surfaces of the upper and lower reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas (in this preferred embodiment, nitrogen ($N_2$) gas) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a nitrogen gas supply source 85. A valve 84 is inserted at some midpoint in the gas supply pipe 83. When the valve 84 is opened, nitrogen gas is fed from the nitrogen gas supply source 85 to the buffer space 82. The nitrogen gas flowing in the buffer space 82 flows in a spreading manner within the buffer space 82 which is lower in fluid resistance than the gas supply opening 81, and is supplied through the gas supply opening 81 into the heat treatment space 65.

On the other hand, at least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The nitrogen gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

FIG. 2 is a perspective view showing the entire external appearance of the holder 7. FIG. 3 is a top plan view of the holder 7. FIG. 4 is a side view of the holder 7 as seen from one side. The holder 7 includes a base ring 71, coupling portions 72, and a temperature equalizing ring 74. The base ring 71, the coupling portions 72, and the temperature equalizing ring 74 are all made of quartz. In other words, the whole of the holder 7 is made of quartz.

The base ring 71 is a quartz member in the form of an annular ring. The base ring 71 is supported by the wall surface of the chamber 6 by being placed on the bottom surface of the recessed portion 62 (with reference to FIG. 1). The multiple coupling portions 72 (in this preferred embodiment, four coupling portions 72) are mounted upright on the upper surface of the base ring 71 in the form of the annular ring and arranged in a circumferential direction of the base ring 71. The coupling portions 72 are quartz members, and are rigidly secured to the base ring 71 by welding. The base ring 71 may be of an arcuate shape such that a portion is removed from the annular ring.

The temperature equalizing ring 74 having an annular shape is supported by the four coupling portions 72 provided on the base ring 71. The temperature equalizing ring 74 is a plate-like member in the shape of an annular ring made of quartz. The temperature equalizing ring 74 has an outside diameter greater than the diameter (in the present preferred embodiment, 300 mm) of the semiconductor wafer W, and an inside diameter smaller than the diameter of the semiconductor wafer W. This enables the temperature equalizing ring 74 to support a peripheral edge portion of the semiconductor wafer W.

The four coupling portions 72 provided upright on the base ring 71 and the lower surface of the temperature equalizing ring 74 are rigidly secured to each other by welding. In other words, the temperature equalizing ring 74 and the base ring 71 are fixedly coupled to each other with the coupling portions 72, and the holder 7 is an integrally formed member made of quartz. The base ring 71 of such a holder 7 is supported by the wall surface of the chamber 6, whereby the holder 7 is mounted to the chamber 6. With the holder 7 mounted to the chamber 6, the annular temperature equalizing ring 74 assumes a horizontal position (a position such that the normal to the temperature equalizing ring 74 coincides with a vertical direction). As shown in FIG. 4, a semiconductor wafer W transported into the chamber 6 is held in a horizontal position, with the peripheral edge portion of the lower surface of the semiconductor wafer W supported by the temperature equalizing ring 74 of the holder 7 mounted to the chamber 6. The lower surface of the semiconductor wafer W except the peripheral edge portion held on the annular temperature equalizing ring 74 is open.

A radiation thermometer 120, and a contact-type thermometer 130 including a thermocouple are provided near the holder 7 mounted to the chamber 6. As shown in FIG. 2, a distal end portion of a probe of the contact-type thermometer 130 comes through a circular opening of the annular temperature equalizing ring 74 into contact with the lower surface of the semiconductor wafer W. The radiation thermometer 120 receives radiant light (infrared light) emitted from the lower surface of the semiconductor wafer W through the circular opening of the temperature equalizing ring 74 to measure the temperature of the semiconductor wafer W, based on the intensity of the radiant light. The transfer mechanism 10 to be described later includes lift pins 12 which also pass vertically through the circular opening of the temperature equalizing ring 74 for the purpose of the transfer of the semiconductor wafer W.

Figure 5:
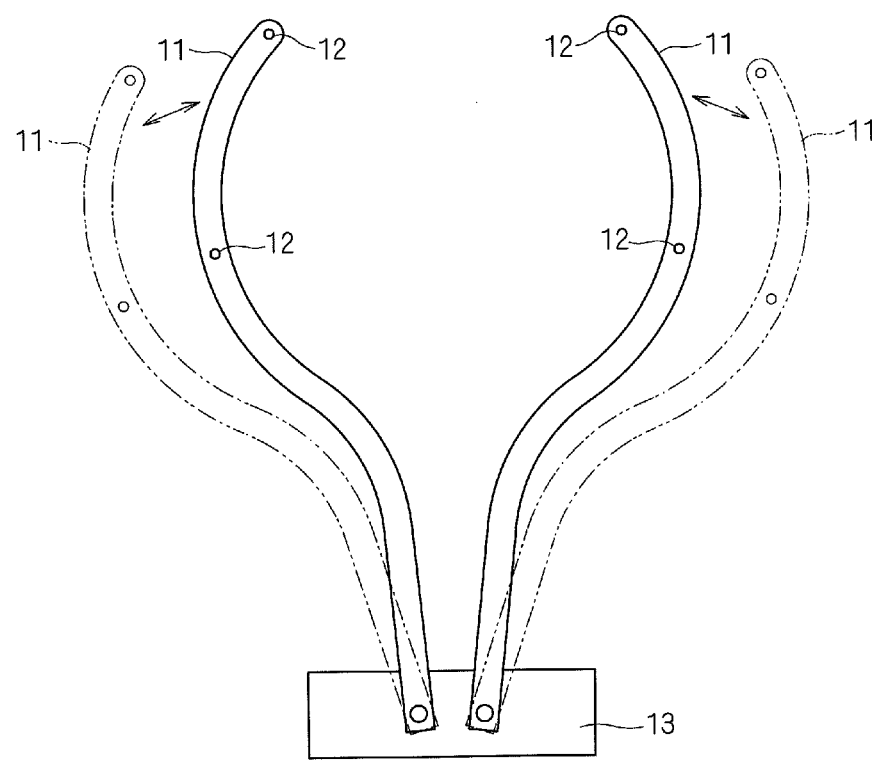
FIG. 5 is a plan view of a transfer mechanism.
Figure 6:
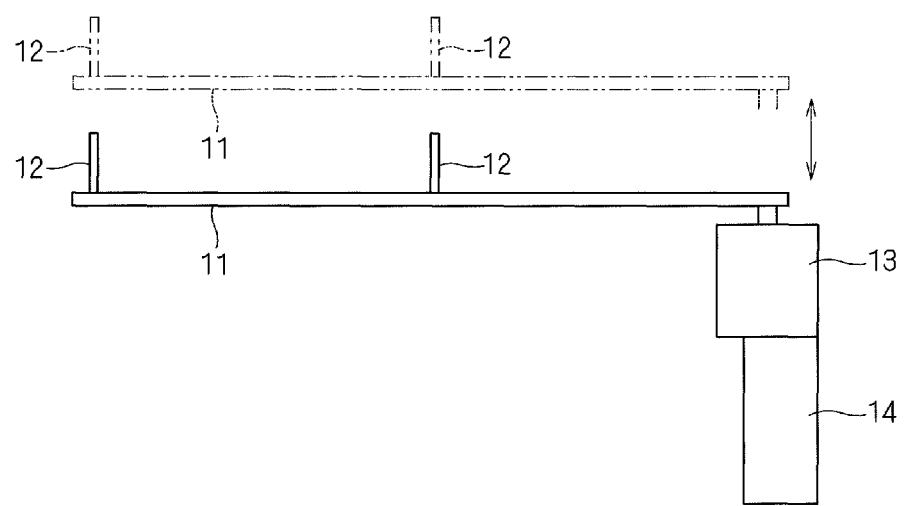
FIG. 6 is a side view of the transfer mechanism.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable in a horizontal plane by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the circular opening of the temperature equalizing ring 74 so that the upper ends of the lift pins 12 protrude from the upper surface of the temperature equalizing ring 74. On the other hand, as the elevating mechanism 14 moves down the pair of transfer arms 11 in their transfer operation position to pull down the lift pins 12 below the temperature equalizing ring 74 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor portion of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Figure 8:
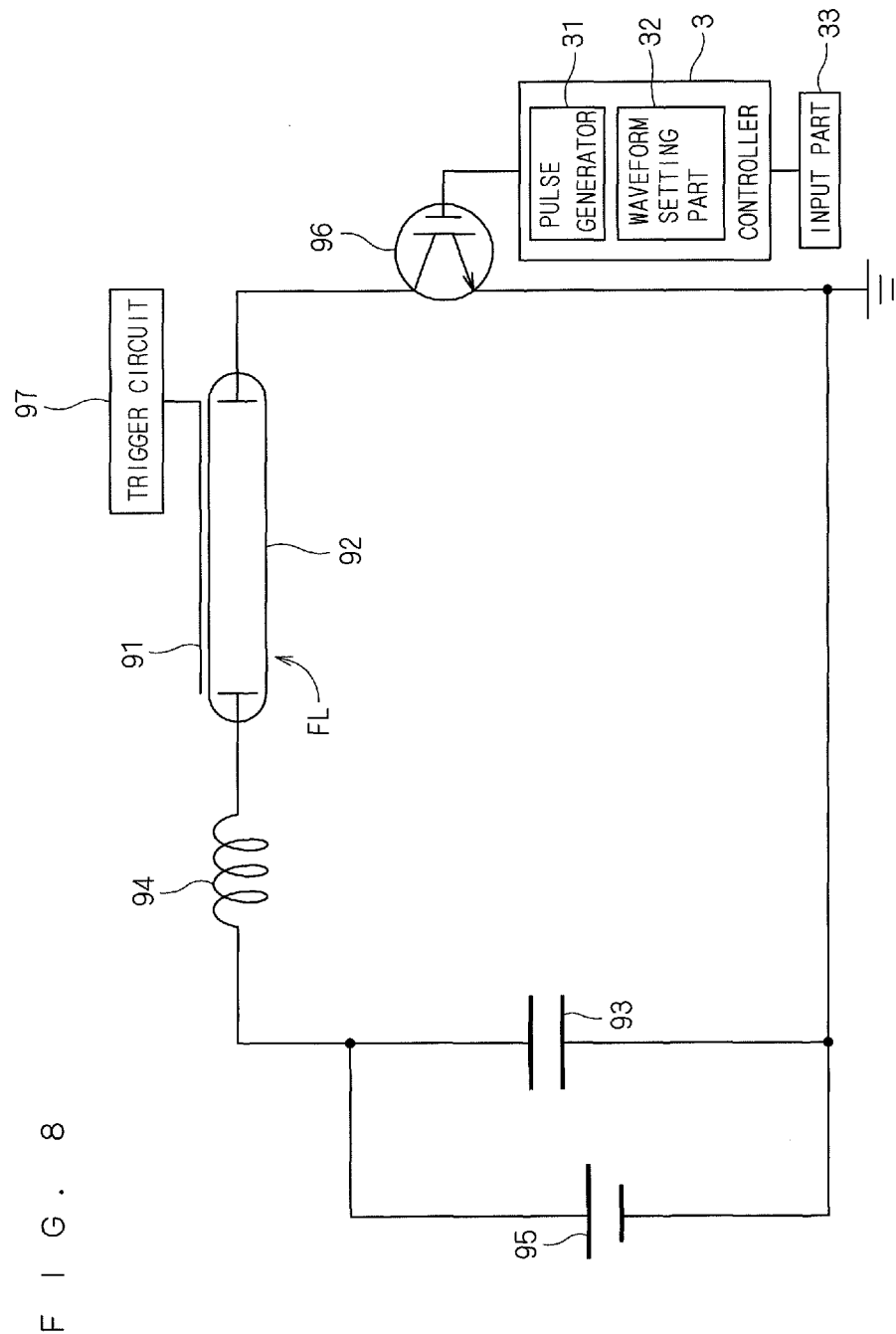
FIG. 8 is a diagram showing a driving circuit for a flash lamp.

FIG. 8 is a diagram showing a driving circuit for each flash lamp FL. As illustrated in FIG. 8, a capacitor 93, a coil 94, a flash lamp FL, and an IGBT (insulated-gate bipolar transistor) 96 are connected in series. Also as shown in FIG. 8, the controller 3 includes a pulse generator 31 and a waveform setting part 32, and is connected to an input part 33. Examples of the input part 33 used herein include various known input devices such as a keyboard, a mouse, and a touch panel. The waveform setting part 32 sets the waveform of a pulse signal, based on an input from the input part 33, and the pulse generator 31 generates the pulse signal in accordance with that waveform.

The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage (charging voltage). A trigger circuit 97 is capable of applying a high voltage to the trigger electrode 91. The timing of the voltage application from the trigger circuit 97 to the trigger electrode 91 is under the control of the controller 3.

The IGBT 96 is a bipolar transistor which includes a MOSFET (metal-oxide-semiconductor field-effect transistor) incorporated in the gate thereof, and is also a switching element suitable for handling a large amount of power. The pulse generator 31 in the controller 3 applies the pulse signal to the gate of the IGBT 96. When a voltage ("high" voltage) not less than a predetermined level is applied to the gate of the IGBT 96, the IGBT 96 turns on. When a voltage ("low" voltage) less than the predetermined level is applied to the gate of the IGBT 96, the IGBT 96 turns off. In this manner, the driving circuit including the flash lamp FL is turned on and off by the IGBT 96. By turning the IGBT 96 on and off, a connection between the flash lamp FL and the capacitor 93 corresponding thereto is made and broken.

Even if, with the capacitor 93 in the charged state, the IGBT 96 turns on to apply a high voltage across the electrodes of the glass tube 92, no electricity will flow through the glass tube 92 in a normal state because the xenon gas is electrically insulative. However, when the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

Also, the reflector 52 shown in FIG. 1 is provided over the plurality of flash lamps FL so as to cover all of the flash lamps FL. A fundamental function of the reflector 52 is to reflect the light emitted from the plurality of flash lamps FL toward the holder 7. The reflector 52 is a plate made of an aluminum alloy. A surface of the reflector 52 (a surface which faces the flash lamps FL) is roughened by abrasive blasting to produce a stain finish thereon.

The multiple (in the present preferred embodiment, 40) halogen lamps HL are incorporated in the halogen heating part 4 provided under the chamber 6. The halogen lamps HL direct light from under the chamber 6 through the lower chamber window 64 toward the heat treatment space 65. FIG. 7 is a plan view showing an arrangement of the multiple halogen lamps HL. In the present preferred embodiment, 20 halogen lamps HL are arranged in an upper tier, and 20 halogen lamps HL are arranged in a lower tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL in the upper tier and the longitudinal direction of the halogen lamps HL in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

Also as shown in FIG. 1, the heat treatment apparatus 1 includes the shutter mechanism 2 provided alongside the halogen heating part 4 and the chamber 6. The shutter mechanism 2 includes a shutter plate 21, and a sliding drive mechanism 22. The shutter plate 21 is a plate opaque to halogen light (light from a halogen light source), and is made of titanium (Ti), for example. The sliding drive mechanism 22 causes the shutter plate 21 to slidably move in a horizontal direction, thereby bringing the shutter plate 21 into and out of a light shielding position lying between the halogen heating part 4 and the holder 7. When the sliding drive mechanism 22 moves the shutter plate 21 forward, the shutter plate 21 is inserted into the light shielding position (a position indicated by dash-double-dot lines in FIG. 1) lying between the chamber 6 and the halogen heating part 4 to provide isolation between the lower chamber window 64 and the plurality of halogen lamps HL. Thus, light directed from the plurality of halogen lamps HL toward the holder 7 in the heat treatment space 65 is intercepted. On the other hand, when the sliding drive mechanism 22 moves the shutter plate 21 backward, the shutter plate 21 is retracted from the light shielding position lying between the chamber 6 and the halogen heating part 4 to open the space lying under the lower chamber window 64.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. Also, as shown in FIG. 8, the controller 3 includes the pulse generator 31 and the waveform setting part 32. As mentioned earlier, the waveform setting part 32 sets the waveform of the pulse signal, based on an input from the input part 33, and the pulse generator 31 outputs the pulse signal to the gate of the IGBT 96 in accordance with the waveform.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate doped with impurities (ions) by an ion implantation process. The impurities with which the semiconductor wafer W is doped are activated by the heat treatment apparatus 1 performing the process of heating (annealing) the semiconductor wafer W by flash irradiation. The procedure for the treatment in the heat treatment apparatus 1 which will be described below proceeds under the control of the controller 3 over the operating mechanisms of the heat treatment apparatus 1.

Figure 9:
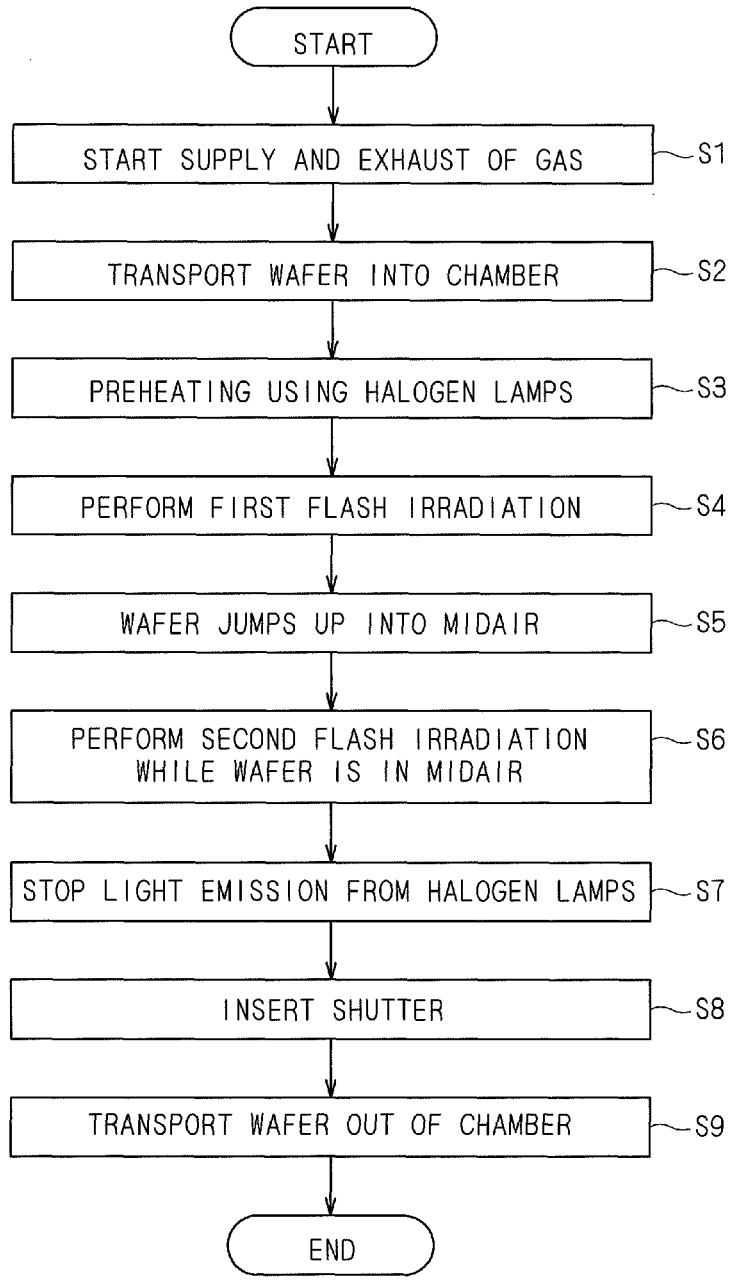
FIG. 9 is a flow diagram showing a procedure for treatment of a semiconductor wafer in the heat treatment apparatus of FIG. 1.

FIG. 9 is a flow diagram showing a procedure for the treatment of a semiconductor wafer W in the heat treatment apparatus 1. First, the valve 84 is opened for supply of gas, and the valves 89 and 192 for exhaust of gas are opened, so that the supply and exhaust of gas into and out of the chamber 6 start (in Step S1). When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with the process steps of FIG. 9.

Subsequently, the gate valve 185 is opened to open the transport opening 66. A transport robot outside the heat treatment apparatus 1 transports a semiconductor wafer W doped with impurities through the transport opening 66 into the heat treatment space 65 in the chamber 6 (in Step S2). The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the circular opening of the temperature equalizing ring 74 and protrude from the upper surface of the temperature equalizing ring 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the temperature equalizing ring 74 of the holder 7, so that the semiconductor wafer W is held in a horizontal position. The semiconductor wafer W is held on the temperature equalizing ring 74 so that a surface thereof which is doped with impurities is the upper surface. As shown in FIG. 4, the semiconductor wafer W is held in a horizontal position, with the peripheral edge portion of the lower surface of the semiconductor wafer W supported by the temperature equalizing ring 74. The pair of transfer arms 11 moved downwardly below the temperature equalizing ring 74 is moved back to the retracted position, i.e. to the inside of the recessed portion 62, by the horizontal movement mechanism 13.

After the semiconductor wafer W is held on the temperature equalizing ring 74 of the holder 7, the 40 halogen lamps HL in the halogen heating part 4 turn on simultaneously to start preheating (or assist-heating) (in Step S3). Halogen light emitted from the halogen lamps HL is transmitted through the lower chamber window 64 made of quartz, and impinges upon the lower surface of the semiconductor wafer W. The semiconductor wafer W is irradiated with the halogen light from the halogen lamps HL, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

Figure 10:
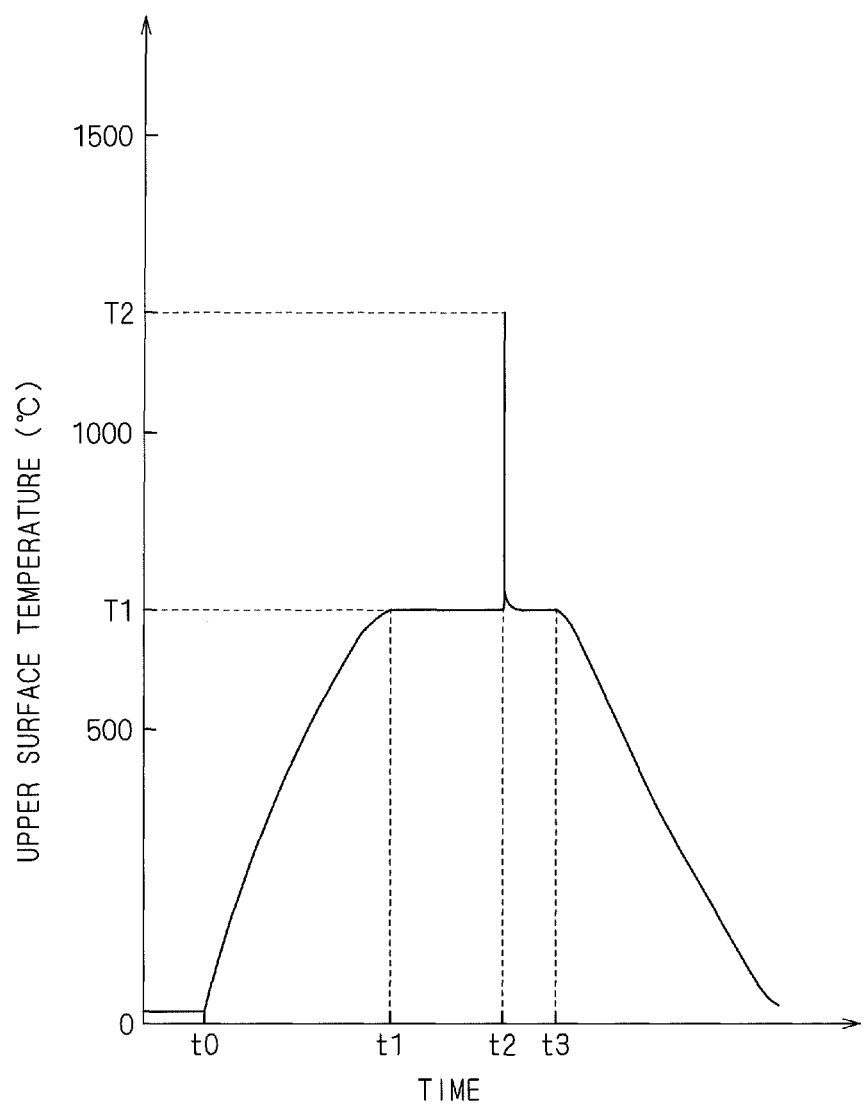
FIG. 10 is a graph showing changes in the temperature of the upper surface of a semiconductor wafer.

FIG. 10 is a graph showing changes in the temperature of the upper surface of the semiconductor wafer W. After the semiconductor wafer W is transported into the heat treatment space 65 and is held on the temperature equalizing ring 74, the controller 3 turns on the 40 halogen lamps HL at time t0, so that the temperature of the semiconductor wafer W irradiated with the halogen light is increased to a preheating temperature T1. The preheating temperature T1 is in the range of 300° to 800° C., and shall be 700° C. in the present preferred embodiment.

The temperature of the semiconductor wafer W is measured with the contact-type thermometer 130 when the halogen lamps HL perform preheating. Specifically, the contact-type thermometer 130 incorporating a thermocouple comes into contact with the lower surface of the semiconductor wafer W held on the temperature equalizing ring 74 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches the predetermined preheating temperature T1 or not. In other words, the controller 3 effects feedback control of the output from the halogen lamps HL so that the temperature of the semiconductor wafer W is equal to the preheating temperature T1, based on the value measured with the contact-type thermometer 130. It should be noted that, when the temperature of the semiconductor wafer W is increased by the irradiation with light from the halogen lamps HL, the temperature is not measured with the radiation thermometer 120. This is because the halogen light emitted from the halogen lamps HL enters the radiation thermometer 120 in the form of disturbance light to obstruct the precise measurement of the temperature.

After the temperature of the semiconductor wafer W reaches the preheating temperature T1, the controller 3 maintains the temperature of the semiconductor wafer W at the preheating temperature T1 for a short time. Specifically, at time t1 when the temperature of the semiconductor wafer W measured with the contact-type thermometer 130 reaches the preheating temperature T1, the controller 3 controls the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Further, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W. This provides a more uniform in-plane temperature distribution of the semiconductor wafer W in the stage of preheating.

Next, the flash lamps FL emit a flash of light to perform a heating treatment at time t2 when a predetermined time period has elapsed since the temperature of the semiconductor wafer W reached the preheating temperature T1. It should be noted that a time period required for the temperature of the semiconductor wafer W at room temperature to reach the preheating temperature T1 (a time interval between the time t1 and the time t1) is only on the order of several seconds, and that a time period required between the instant at which the temperature of the semiconductor wafer W reaches the preheating temperature T1 and the instant at which the flash lamps FL emit light (a time interval between the time t1 and the time t2) is also only on the order of several seconds. For flash irradiation from a flash lamp FL, the capacitor 93 is charged in advance by the power supply unit 95. Then, with the capacitor 93 in the charged state, the pulse generator 31 in the controller 3 outputs a pulse signal to the gate of the IGBT 96 to drive the IGBT 96 on and off. In the present preferred embodiment, the connection between the capacitor 93 and the flash lamp FL is made and broken by driving the IGBT 96 on and off, whereby the flash lamp FL emits light twice, that is, performs the flash irradiation twice.

Figure 11:
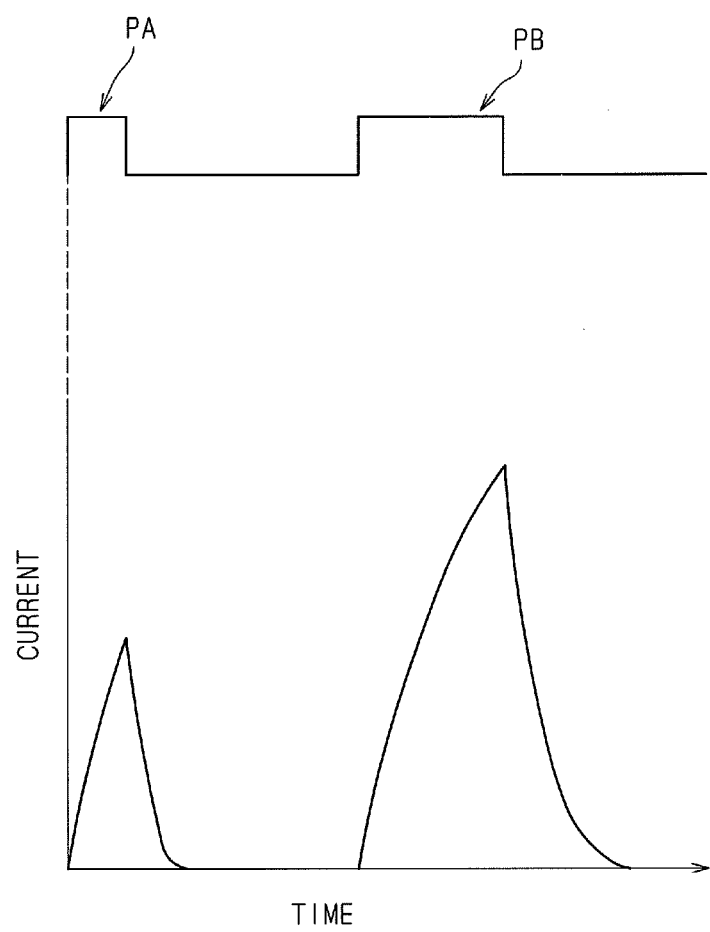
FIG. 11 is a graph showing an example of a correlation between the waveform of a pulse signal and a current flowing through a flash lamp.

FIG. 11 is a graph showing an example of a correlation between the waveform of the pulse signal and a current flowing through the flash lamp FL. The waveform of the pulse signal outputted from the pulse generator 31 is shown in an upper part of FIG. 11, and the waveform of the current flowing in the circuit of FIG. 8 including the flash lamp FL is shown in a lower part of FIG. 11. In the present preferred embodiment, the pulse signal having rectangular waves as shown in the upper part of FIG. 11 is outputted from the pulse generator 31. The waveform of the pulse signal is specified by inputting from the input part 33 a recipe that is a sequence of defined parameters including a time interval (ON time) equivalent to the pulse width and a time interval (OFF time) between pulses. After an operator inputs such a recipe from the input part 33 to the controller 3, the waveform setting part 32 in the controller 3 sets a pulse waveform having repeated ON and OFF time intervals as shown in the upper part of FIG. 11 in accordance with the recipe. A first pulse PA having a relatively short pulse width and corresponding to the first time of flash irradiation (first flash irradiation) is set in an early part of the pulse waveform shown in the upper part of FIG. 11, and a second pulse PB having a relatively long pulse width and corresponding to the second time of flash irradiation (second flash irradiation) is set in a late part thereof. Then, the pulse generator 31 outputs the pulse signal in accordance with the pulse waveform set by the waveform setting part 32. As a result, the pulse signal having the waveform as shown in the upper part of FIG. 11 is applied to the gate of the IGBT 96 to control the driving on and off of the IGBT 96. Specifically, the IGBT 96 is on when the pulse signal inputted to the gate of the IGBT 96 is on, and the IGBT 96 is off when the pulse signal is off.

In synchronism with the turning on of the IGBT 96 for each turning on of the pulse signal outputted from the pulse generator 31, the controller 3 controls the trigger circuit 97 to apply a high voltage (trigger voltage) to the trigger electrode 91. When the first pulse PA is inputted to the gate of the IGBT 96, with the electrical charges stored in the capacitor 93, and the high voltage is applied to the trigger electrode 91 in synchronism with the input of the first pulse PA, then a current starts flowing across the electrodes of the glass tube 92 of the flash lamp FL, and the resultant excitation of xenon atoms or molecules induces light emission, whereby the first flash irradiation is performed (in Step S4). After the first pulse PA goes off, the value of the current flowing in the glass tube 92 of the flash lamp FL decreases, and the flash lamp FL completely turns off temporarily.

Next, when the second pulse PB is inputted to the gate of the IGBT 96 and the high voltage is applied to the trigger electrode 91 in synchronism with the input of the second pulse PB, then a current starts flowing again across the electrodes of the glass tube 92, whereby the second flash irradiation from the flash lamp FL is performed (in Step S6). After the second pulse PB goes off, the value of the current flowing in the glass tube 92 decreases, and the flash lamp FL turns off again. In this manner, the current having the waveform as shown in the lower part of FIG. 11 flows through the flash lamp FL, so that the flash lamp FL emits light twice. It should be noted that an individual current waveform corresponding to each pulse is defined by the constant of the coil 94.

The light emission output from the flash lamp FL is roughly proportional to the current flowing through the flash lamp FL raised to the power of 1.5. Thus, the output waveform (profile) of the light emission output from the flash lamp FL has a pattern similar to that of the current waveform shown in the lower part of FIG. 11. Such two iterations of flash irradiation are performed on the upper surface of the semiconductor wafer W held on the temperature equalizing ring 74 of the holder 7 in accordance with the output waveform from the flash lamp FL similar to that shown in the lower part of FIG. 11. In the present preferred embodiment, the second pulse PB is longer in pulse width than the first pulse PA, and accordingly results in the flow of current through the flash lamp FL for a longer period of time. Thus, the second flash irradiation is greater in light emission output than the first flash irradiation.

In Step S4 of FIG. 9, when the first pulse PA is inputted to the gate of the IGBT 96 and the high voltage is applied to the trigger electrode 91 in synchronism with the input of the first pulse PA, the first flash irradiation from the flash lamp FL is performed on the upper surface of the semiconductor wafer W. This first flash irradiation causes the temperature of the upper surface of the semiconductor wafer W to momentarily increase. On the other hand, the temperature of the lower surface at that instant does not increase so high from the preheating temperature T1. In other words, a temperature difference arises momentarily between the upper and lower surfaces of the semiconductor wafer W. As a result, there arises abrupt thermal expansion of the upper surface of the semiconductor wafer W, whereas the lower surface of the semiconductor wafer W hardly expands thermally. Thus, the semiconductor wafer W is momentarily warped in such a manner that the upper surface thereof becomes a convex surface. Because of the occurrence of the momentary warpage such that the upper surface becomes the convex surface, the peripheral edge portion of the lower surface of the semiconductor wafer W kicks the temperature equalizing ring 74. As a result, the semiconductor wafer W jumps up from the temperature equalizing ring 74 into midair (in Step S5), as shown in FIG. 12.

While the semiconductor wafer W is in midair above the temperature equalizing ring 74, the second pulse PB is inputted to the gate of the IGBT 96, and the high voltage is applied to the trigger electrode 91 in synchronism with the input of the second pulse PB, whereby the second flash irradiation from the flash lamp FL is performed on the upper surface of the semiconductor wafer W (in Step S6). This second flash irradiation causes the temperature of the upper surface of the semiconductor wafer W to momentarily increase to a treatment temperature T2 of not less than 1000° C. (in the present preferred embodiment, 1200° C.). Increasing the upper surface of the semiconductor wafer W momentarily to not less than 1000° C. in this manner achieves the activation of the impurities implanted in the semiconductor wafer W while suppressing the diffusion of the impurities due to heat. It should be noted that the graph of FIG. 10 is plotted with a time scale of seconds, whereas the time interval between the first flash irradiation and the second flash irradiation is in units of milliseconds. Thus, such two iterations of the flash irradiation may be regarded as being performed at the time t2 in FIG. 10.

After such two iterations of the flash irradiation using the flash lamp FL are completed, the IGBT 96 turns off to stop the light emission from the flash lamp FL. Then, the temperature of the upper surface of the semiconductor wafer W decreases rapidly from the treatment temperature T2. Referring again to FIGS. 9 and 10, the halogen lamps HL turn off at time t3 which is a predetermined time period later than the completion of the two iterations of the flash irradiation (in Step S7). Thus, the temperature of the semiconductor wafer W starts decreasing from the preheating temperature T1. At the same time that the halogen lamps HL turn off, the shutter mechanism 2 inserts the shutter plate 21 into the light shielding position lying between the halogen heating part 4 and the chamber 6 (in Step S8). The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the rate at which the temperature of the semiconductor wafer W decreases.

At the time of the insertion of the shutter plate 21 into the light shielding position, the radiation thermometer 120 starts measuring the temperature. Specifically, the radiation thermometer 120 measures the intensity of infrared radiation emitted from the lower surface of the semiconductor wafer W held by the holder 7 through the circular opening of the temperature equalizing ring 74 to measure the temperature of the semiconductor wafer W which is on the decrease. The measured temperature of the semiconductor wafer W is transmitted to the controller 3.

Some radiant light is continuously emitted from the halogen lamps HL at elevated temperature immediately after the turning off. The radiation thermometer 120, however, measures the temperature of the semiconductor wafer W when the shutter plate 21 is inserted in the light shielding position. Thus, the radiant light directed from the halogen lamps HL toward the heat treatment space 65 of the chamber 6 is interrupted. This allows the radiation thermometer 120 to precisely measure the temperature of the semiconductor wafer W held on the temperature equalizing ring 74 without being influenced by disturbance light.

The controller 3 monitors whether the temperature of the semiconductor wafer W measured with the radiation thermometer 120 decreases to a predetermined temperature or not. After the temperature of the semiconductor wafer W decreases to the predetermined temperature or below, the pair of transfer arms 11 of the transfer mechanism 10 is moved horizontally again from the retracted position to the transfer operation position and is then moved upwardly, whereby the lift pins 12 protrude from the upper surface of the temperature equalizing ring 74 to receive the heat-treated semiconductor wafer W from the temperature equalizing ring 74. Subsequently, the transport opening 66 which has been closed is opened by the gate valve 185, and the transport robot outside the heat treatment apparatus 1 transports the semiconductor wafer W placed on the lift pins 12 to the outside (in Step S9). Thus, the heat treatment apparatus 1 completes the heating treatment of the semiconductor wafer W.

In the present preferred embodiment, the first flash irradiation from the flash lamps FL is performed on the upper surface of the semiconductor wafer W supported by the temperature equalizing ring 74 of the holder 7 to cause the semiconductor wafer W to jump up from the temperature equalizing ring 74 into midair in the heat treatment space 65. While the semiconductor wafer W is in midair above the temperature equalizing ring 74, the second flash irradiation from the flash lamps FL is performed on the upper surface of the semiconductor wafer W to increase the temperature of the upper surface of the semiconductor wafer W to the treatment temperature T2.

While being in midair and isolated from the temperature equalizing ring 74 by the first flash irradiation, the semiconductor wafer W is subject to no restraints, and is hence freely deformable. When the second flash irradiation is performed, only the upper surface of the semiconductor wafer W is thermally expanded because of a temperature difference between the upper and lower surfaces of the semiconductor wafer W, so that warpage occurs in the semiconductor wafer W in such a manner that the upper surface thereof becomes a convex surface. At this time, however, no reaction stresses are exerted on the semiconductor wafer W. For this reason, wafer cracking resulting from the fact that the semiconductor wafer W is restrained from becoming deformed when the second flash irradiation is performed is prevented. Also, the second flash irradiation performed while the semiconductor wafer W is in midair above the temperature equalizing ring 74 avoids a collision of the momentarily deformed semiconductor wafer W with the temperature equalizing ring 74 to prevent cracking resulting from the collision. The semiconductor wafer W does not jump further from its midair position, no matter how the semiconductor wafer W becomes deformed while being in midair above the temperature equalizing ring 74. Thus, cracking resulting from a collision of the semiconductor wafer W with the upper chamber window 63 is also prevented. Also, damage to the temperature equalizing ring 74 resulting from a collision of the semiconductor wafer W with the temperature equalizing ring 74 is prevented.

The purpose of the first flash irradiation is to raise the semiconductor wafer W in midair to such a degree that the semiconductor wafer W that will become deformed during the second flash irradiation does not contact the temperature equalizing ring 74. If the semiconductor wafer W jumps up excessively high from the temperature equalizing ring 74 during the first flash irradiation, there is a danger that the semiconductor wafer W collides with the upper chamber window 63. Thus, the intensity of a flash of light during the first flash irradiation shall be controlled to such a degree that the semiconductor wafer W that jumps up does not contact the upper chamber window 63 and that the semiconductor wafer W does not contact the temperature equalizing ring 74 during the second flash irradiation.

The purpose of the second flash irradiation is, on the other hand, to increase the temperature of the upper surface of the semiconductor wafer W to the intended treatment temperature T2. Thus, the intensity of a flash of light during the second flash irradiation shall be controlled to such a degree that the temperature of the upper surface of the semiconductor wafer W increases to the treatment temperature T2.

If the second flash irradiation for increasing the temperature of the upper surface of the semiconductor wafer W to the treatment temperature T2 is performed without performing the first flash irradiation, the semiconductor wafer W becomes significantly deformed momentarily. The semiconductor wafer W might be cracked because of stresses from the temperature equalizing ring 74 during the deformation or be cracked because of a collision of the semiconductor wafer W jumping up high from the temperature equalizing ring 74 with the upper chamber window 63. In the present preferred embodiment, the first flash irradiation is initially performed to cause the semiconductor wafer W to jump up slightly from the temperature equalizing ring 74. Then, while the semiconductor wafer W is in midair, the second flash irradiation is performed to increase the temperature of the upper surface of the semiconductor wafer W to the treatment temperature T2.

Such two iterations of the flash irradiation reduce the total amount of jumping of the semiconductor wafer W, as compared with that obtained when only the second flash irradiation is performed, to eliminate the danger of the collision of the semiconductor wafer W with the upper chamber window 63, thereby preventing wafer cracking. Further, the stresses generated between the semiconductor wafer W and the temperature equalizing ring 74 when the two iterations of the flash irradiation are performed are reduced, as compared with those generated when only the second flash irradiation is performed. This prevents damages to the temperature equalizing ring 74 and cracking in the semiconductor wafer W.

The amount of jumping of the semiconductor wafer W resulting from the first flash irradiation must be smaller than that resulting from only the second flash irradiation. For this reason, the intensity of a flash of light during the first flash irradiation is lower than that during the second flash irradiation. The intensity of flashes of light may be controlled by adjusting the widths of the pulses PA and PB.

The time interval between the first flash irradiation and the second flash irradiation is set so that the second flash irradiation is performed while the semiconductor wafer W is raised in midair above the temperature equalizing ring 74 by the first flash irradiation. Specifically, the time interval between the first flash irradiation and the second flash irradiation is in the range of 1 to 500 milliseconds.

While the preferred embodiment according to the present invention has been described hereinabove, various modifications of the present invention in addition to that described above may be made without departing from the scope and spirit of the invention. In the aforementioned preferred embodiment, for example, each time the pulse signal outputted from the pulse generator 31 turns on, the high voltage is applied to the trigger electrode 91 in synchronism with the turning on of the pulse signal. However, the present invention is not limited to this. The high voltage may be applied to the trigger electrode 91 only when the pulse signal initially turns on. In such a case, it is preferable that the IGBT 96 is driven on and off at slight time intervals during the flash irradiation to produce small flashes repeatedly, thereby causing slight current to continuously flow through the flash lamp FL. This ensures the emission of light from the flash lamp FL during the next flash irradiation. When the time interval between the iterations of the flash irradiation (the time interval between the first flash irradiation and the second flash irradiation) is approximately 15 milliseconds or less, there are cases where the flash lamp FL is caused to emit light again only by the IGBT 96 subsequently turning on to make the connection between the capacitor 93 and the flash lamp FL without the continuous flow of the slight current.

Also, when the high voltage is applied to the trigger electrode 91 each time the pulse signal outputted from the pulse generator 31 turns on, the trigger voltage may be applied after a predetermined time period has elapsed since the turning on of the pulse signal for the purpose of ensuring the discharge through the flash lamp FL. In such a case, the irradiation time period of the flash lamp FL is a time interval between the application of the high voltage to the trigger electrode 91 and the turning off of the pulse signal, and is different from that according to the aforementioned preferred embodiment (wherein the irradiation time period is equal to the time interval equivalent to the pulse width). Also, the time interval (non-irradiation time period) between the two iterations of the flash irradiation from the flash lamp FL is a time interval between the turning off of the pulse signal and the application of the trigger voltage corresponding to the next pulse.

Also, the material of the temperature equalizing ring 74 is not limited to quartz, but may be silicon carbide (SiC) and boron nitride (BN). Further, the semiconductor wafer W is held on the temperature equalizing ring 74 having an annular shape in the aforementioned preferred embodiment. However, the semiconductor wafer W may be held on a planar plate member in place of the temperature equalizing ring 74. The plate member is preferably made of a material which allows the halogen light from the halogen lamps HL to pass therethrough, e.g. quartz.

In the aforementioned preferred embodiment, the first flash irradiation is performed to cause the semiconductor wafer W to jump up from the temperature equalizing ring 74, and the second flash irradiation is performed while the semiconductor wafer W is in midair above the temperature equalizing ring 74. However, the entire semiconductor wafer W need not always be completely in midair above the temperature equalizing ring 74 during the second flash irradiation. If at least part of the semiconductor wafer W is in midair above the temperature equalizing ring 74, a collision of the semiconductor wafer W jumping up high from the temperature equalizing ring 74 with the upper chamber window 63 is avoided when the second flash irradiation is performed. In other words, the term "in midair" as used herein shall include a concept that at least part of the semiconductor wafer W is in midair above the temperature equalizing ring 74.

Also, the setting of the waveform of the pulse signal is not limited to inputting the parameters including the pulse width and the like one by one from the input part 33. For example, the setting of the waveform may be done by an operator inputting the waveform directly in graphical form from the input part 33, by reading the waveform previously set and stored in a storage part such as a magnetic disk and the like, or by downloading the waveform from outside the heat treatment apparatus 1.

Although the IGBT 96 is used as a switching element in the aforementioned preferred embodiment, another transistor capable of turning on and off the circuit in accordance with the signal level inputted to the gate thereof may be used in place of the IGBT 96. It is, however, preferable to use an IGBT and a GTO (gate turn-off) thyristor which are suitable for handling a large amount of power as a switching element because the emission of light from the flash lamps FL consumes a considerably large amount of power.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Also, in the aforementioned preferred embodiment, the semiconductor wafer W is preheated by irradiating the semiconductor wafer W with halogen light from the halogen lamps HL. The technique for preheating is not limited to this, but the semiconductor wafer W may be preheated by placing the semiconductor wafer W on a hot plate.

Moreover, a substrate to be processed or treated by the heat treatment apparatus according to the present invention is not limited to a semiconductor wafer, but may be a glass substrate for use in a flat panel display for a liquid crystal display apparatus and the like, and a substrate for a solar cell. Also, the technique according to the present invention may be applied to the joining of metal and silicon, and to the crystallization of polysilicon.

While the invention has been described in detail, the foregoing description is in all aspects illustrative and not restrictive. It is understood that numerous other modifications and variations can be devised without departing from the scope of the invention.

What is claimed is:

1. A method of heating a substrate by irradiating the substrate with a flash of light, the method comprising the steps of:
    (a) supporting a substrate on a support member;
    (b) irradiating an upper surface of the substrate supported on said support member with a first flash of light to cause said substrate to jump up from said support member; and
    (c) irradiating the upper surface of said substrate with a second flash of light to perform a heating treatment while said substrate is jumping in midair above said support member, without the substrate being in contact with any member,
    wherein
    in step (b), said substrate is caused to jump up from said support member to only such a degree that when said substrate becomes deformed during the second flash irradiation in said step (c), the deformed substrate does not contact said support member.

2. The method according to claim 1, wherein said first flash of light is lower in intensity than said second flash of light.

3. The method according to claim 2, wherein a time interval between the irradiation with said first flash of light and the irradiation with said second flash of light is in the range of 1 to 500 milliseconds.

4. The method according to claim 1, wherein said support member is in the shape of a ring.

* * * * *